(12) United States Patent
Bollman et al.

(10) Patent No.: US 6,987,071 B1
(45) Date of Patent: Jan. 17, 2006

(54) SOLVENT VAPOR INFILTRATION OF ORGANIC MATERIALS INTO NANOSTRUCTURES

(75) Inventors: Brent J. Bollman, Belmont, CA (US); Klaus Petritsch, Foster City, CA (US); Matthew R. Robinson, San Francisco, CA (US)

(73) Assignee: Nanosolar, Inc., Palo Alto, CA (US)

( * ) Notice: Subject to any disclaimer, the term of this patent is extended or adjusted under 35 U.S.C. 154(b) by 68 days.

(21) Appl. No.: 10/719,041

(22) Filed: Nov. 21, 2003

(51) Int. Cl.
*H01L 21/31* (2006.01)
*H01L 21/469* (2006.01)
*H01L 21/00* (2006.01)

(52) U.S. Cl. .................. 438/780; 438/60; 438/75; 977/DIG. 1

(58) Field of Classification Search .......... 438/82, 438/99, 623, 780, 60, 75; 257/40, 642
See application file for complete search history.

(56) References Cited

U.S. PATENT DOCUMENTS

| | | | | |
|---|---|---|---|---|
| 6,630,772 B1 * | 10/2003 | Bower et al. | ............... | 313/311 |
| 2003/0203139 A1 * | 10/2003 | Ren et al. | .................. | 428/34.3 |
| 2003/0206332 A1 * | 11/2003 | Yamazaki et al. | .......... | 359/312 |
| 2004/0010048 A1 * | 1/2004 | Evans et al. | ................... | 521/50 |

OTHER PUBLICATIONS

Emer Lahiff, et al., "Selective Positioning and Density Control of Nanotubes within a Polymer Thin Film," Nano Letters vol. 3, No. 10, 2003, pp. 1333-1337.*

B. McCarthy, et al., "Microscopy studies of nanotube-conjugated polymer interactions," Synthetic Materials vol. 121, 2001, pp. 1225-1226.*

R. Haggenmueller, et al., "Aligned single-wall carbon nanotubes in composites by melt processing methods," Chemical Physics Letters vol. 330, 2000, pp. 219-225.*

"Glossary of Abbreviations and Plastics Terms" [online], [retrieved on Jun. 16, 2005]. Retrieved from the Internet <URL: from http://www.ctsmachinery.com.au/glossary.asp?letter=p&page=6>.

Glenn Bartholomew and Alan J. Heeger in "Infiltration of Regioregular Poly[2,2'-(3hexylthiophene)] into Random Nanocrystalline $TiO_2$ Networks", Adv. Funct. Mater., vol. 15, No. 4., Apr., 2005.

* cited by examiner

*Primary Examiner*—Carl Whitehead, Jr.
*Assistant Examiner*—Heather A. Doty
(74) *Attorney, Agent, or Firm*—JDI Patent; Joshua D. Isenberg

(57) ABSTRACT

Spaces in a nanostructure can be filled with an organic material while in the solid state below $T_m$ (without heating) by exposing the organic material to solvent vapor while on or mixed with the nanostructured material. The exposure to solvent vapor results in intimate contact between the organic material and the nanostructured material without having to expose them to possibly detrimental heat to melt in the organic material. Solution processing methods need only to be employed to create bulk films while organic material infiltration can take place in the solid state after depositing the film.

20 Claims, 3 Drawing Sheets

SOLVENT VAPOR INFILTRATION OF ORGANIC MATERIALS INTO NANOSTRUCTURES

CROSS-REFERENCE TO RELATED APPLICATION

This application is related to commonly assigned, co-pending application Ser. No. 10/719,040, filed 21 Nov. 2003, the entire disclosures of which are incorporated herein by reference. This application is also related to commonly assigned U.S. patent application Ser. No. 10/443,456, the entire disclosures of which are incorporated herein by reference.

FIELD OF THE INVENTION

The present invention relates to processing of organic materials and more particularly to filling spaces in nanostructures with organic materials.

BACKGROUND OF THE INVENTION

Recently, devices have been developed that use electrically conducting and/or semiconductor polymers, or other organic materials, as active materials that fill empty spaces in nanometer-scale structures. Filling such spaces, e.g., pores, cavities, tubes, or interstitial spaces between pores, tubes or rods, with an organic material typically requires heating the polymer to temperatures up to 250° C. or more, depending on the type of organic material. Unfortunately, organic materials can be degraded by such heat treatment, which can be detrimental to the resulting device.

Thus, there is a need in the art, for a non-destructive method for depositing polymers into functional nanostructures without dissolving or melting the polymer.

BRIEF DESCRIPTION OF THE DRAWINGS

The teachings of the present invention can be readily understood by considering the following detailed description in conjunction with the accompanying drawings, in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

According to embodiments of the present invention, empty spaces in a nanostructure can be filled with a polymer or other organic material (such as a small molecule, e.g., fullerene, pigment, or dye) at room temperature by lowering the glass transition temperature $T_g$ by exposing the polymer to solvent vapor while on or mixed with the nanostructured material. The exposure to solvent vapor results in intimate contact between the polymer and the nanostructured material without having to expose them to possibly detrimental heat to melt in the polymer. Solution processing methods need only to be employed to create bulk films while polymer infiltration can take place in the solid state after depositing the film.

Figure 1A:
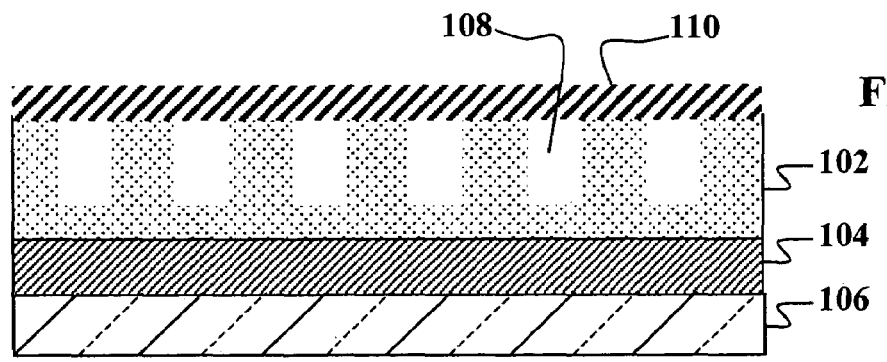
FIGS. 1A–1C are a sequence of cross-sectional schematic diagrams illustrating a method for solvent vapor infiltration of a polymer into a nanostructure according to an embodiment of the present invention.

For example, as shown in FIG. 1A, an organic material 110 is disposed on a nanostructured material 102. The nanostructured material may be formed or otherwise disposed on an electrode 104, e.g., a metal foil. The electrode 104 may be disposed on a substrate 106 such as a glass or polymer.

In preferred embodiments of the present invention the organic material 110 is a conducting or semiconducting polymer. Examples of such polymers include poly(phenylene) and derivatives thereof, poly(phenylene vinylene) and derivatives thereof (e.g., poly(2-methoxy-5-(2-ethylhexyloxy)-1,4-phenylene vinylene (MEH—PPV), poly (para-phenylene vinylene), (PPV)), PPV copolymers poly (thiophene) and derivatives thereof (e.g., poly(3-octylthiophene-2,5,-diyl), regioregular, poly(3-octylthiophene-2,5,-diyl), regiorandom, poly(3-hexylthiophene) (P3HT), poly(3-hexylthiophene-2,5-diyl), regioregular, poly(3-hexylthiophene-2,5-diyl), regiorandom), MDMO, poly(thienylenevinylene) and derivatives thereof, and poly(isothianaphthene) and derivatives thereof, tetra-hydro-thiophene precursors and derivatives thereof, poly-phenylene-vinylene and derivatives organometallic polymers, polymers containing perylene units, poly (squaraines) and their derivatives, discotic liquid crystals polyfluorenes, polyfluorene copolymers, polyfluorene-based copolymers and blends, e.g. co-polymerized and/or blended with charge transporting (e.g. tri-phenyl-amines and derivatives) and/or light-absorbing compounds (e.g. fused thiophene rings and derivatives, generally hetero-atom ring compounds with or without substituents), and/or fullerenes, dyes or pigments. In alternative embodiments the organic material 110 can be a fullerene, dye, pigment or other organic molecule such as pentacene or pentacene precursors.

The organic material 110 may be disposed on the nanostructured material 102 by any suitable technique, e.g., spin coating, web coating, doctor blade coating, spray coating, inkjet printing, organic vapor jet printing and the like.

The nanostructured material has numerous spaces 108 that are several nanometers across, e.g., between about 50 nm and about 1000 nm across. The nanostructures can be in the form of tubes in a nanotubular template, e.g., 1 nm to 1000 nm in diameter with a tube density between about $10^{12}$ tubes/m$^2$ and about $10^{16}$ tubes/m$^2$. Alternatively, the spaces 108 can be nanopores, cavities, or interstitial spaces between pores, tubes or rods. By way of example, the nanostructured material 102 may be fabricated by anodization techniques or surfactant temptation techniques. Examples of anodization techniques are described e.g., in commonly assigned co-pending U.S. patent application Ser. No. 10/443,456 filed May 21, 2003, which is incorporated herein by reference. Examples of surfactant temptation techniques are described in commonly assigned co-pending U.S. patent application Ser. Nos. 10/290,119 and 10/303,665 respectively filed Nov. 5, 2002 and Nov. 22, 2002, both of which are incorporated herein by reference.

Figure 1B:
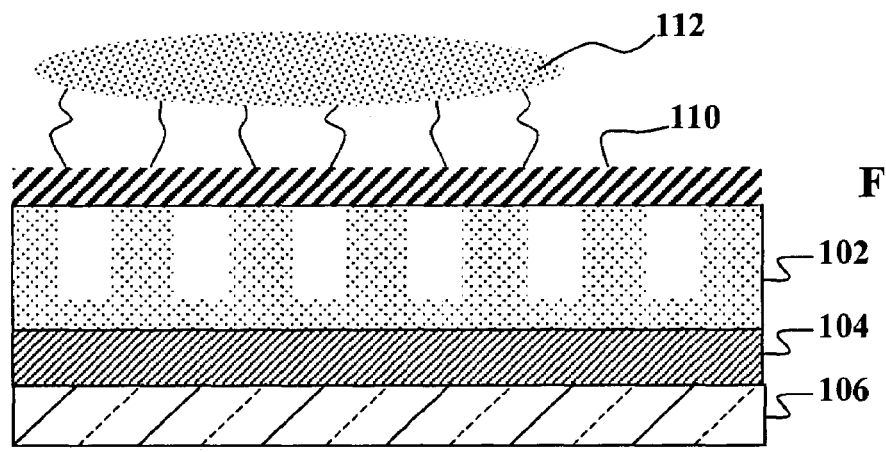
Figure 1C:
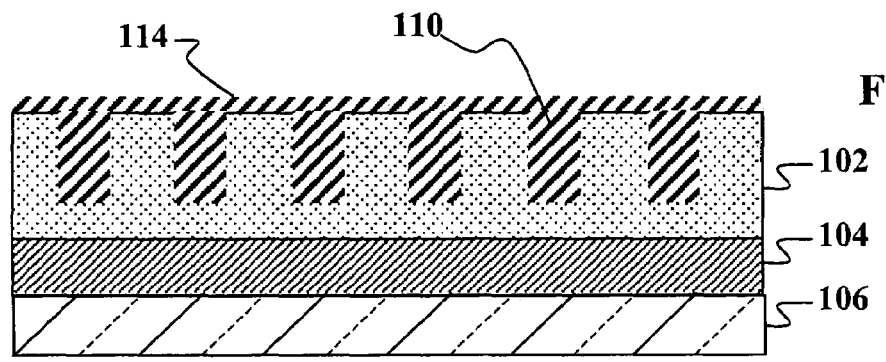

As shown in FIG. 1B, the organic material 110 is exposed to a solvent vapor 112. For example, when the organic material 110 is a polymer, exposure to the solvent vapor 112 mobilizes the polymer chains in the polymer without dissolving or melting it. This allows the organic material 110 to infiltrate the open spaces 108 as shown in FIG. 1C. Suitable solvents include both organic and aqueoussolvents (e.g., water). Examples of suitable organic solvents include but are not limited to acetone, chloroform, benzene, cyclohexane, dichloromethane, ethanol, diethyl ether, ethyl acetate, hexane, methanol, toluene, xylene, mixtures of two or more of these, and derivatives of one or more of these.

Any solvent/organic material pair can be used. By way of example, the inventors have infiltrated anodized nanotemplates with P3HT and MEH—PPV using the solvent vapor treatment described above. Infiltration of pores into anodized nanostructured templates (ANT) and titanium nanotubes (TNT) has been verified with scanning electron microscopy (SEM). Although there may be some gaps in the fill, the structure is reasonably close to fully filled. Depending on the amount of organic material 110 initially disposed on the nanostructured material 102, some portion 114 of the organic material may remain disposed on the nanostructured material 102 after the spaces 108 have been infiltrated.

Figure 1D:
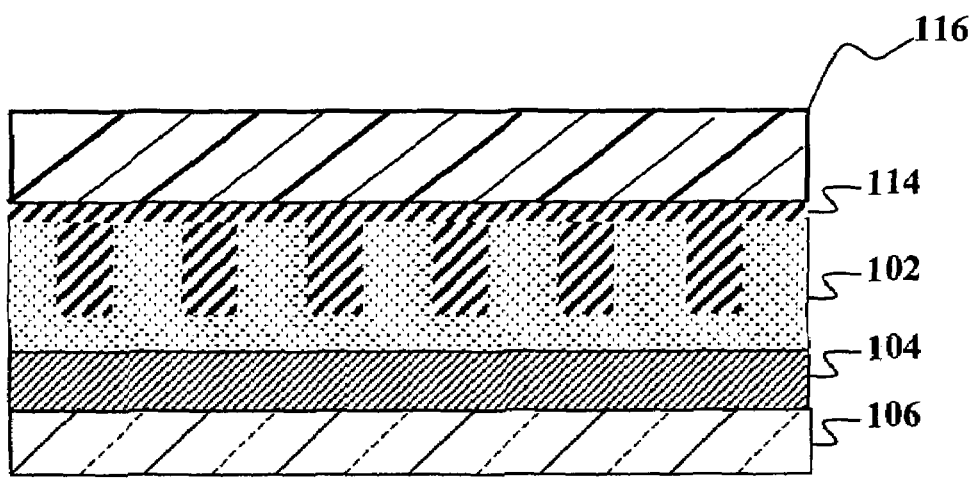
FIGS. 1D–1E are a sequence of cross-sectional schematic diagrams illustrating fabrication of a device.
Figure 1E:
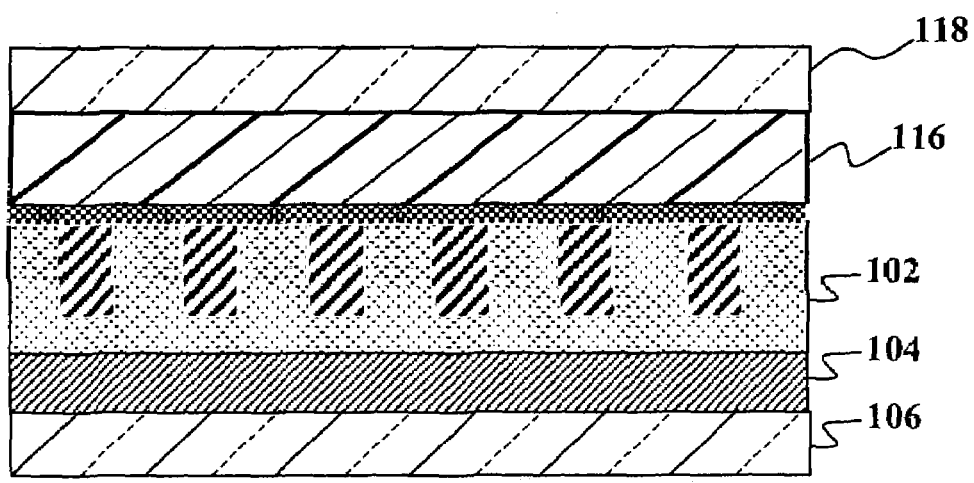

A photovoltaic device can then be fabricated from the resulting structure if the organic material 110 is a conductor or semiconductor and the nanostructured material 102 is a semiconductor having complementary charge transfer properties to the organic material 110 (i.e., if the organic material 110 is an electron transporter and the nanostructured material 102 is a hole transporter or vice versa). A transparent electrode can then be disposed in electrical contact with the organic material 110 in the spaces 108 as shown in FIG. 1D. For example, the remaining portion 114 of the organic material can serve as a charge transporting. Such a charge-transporting layer enhances electrical contact between the organic material 110 in the spaces 108 and the transparent electrode 114. The photovoltaic device can be encapsulated with an encapsulant layer 116 disposed on the transparent conducting layer 114 as shown in FIG. 1E.

Solvent vapor infiltration of organic material such as conjugated polymers into nanostructured templates has been demonstrated to be superior to thermal infiltration. Scanning electron micrographs show a greater degree of pore filling for solvent vapor infiltration compared to thermal infiltration. Furthermore, the device characteristics (e.g., current-voltage characteristics) of devices made using solvent vapor infiltration are generally superior to comparable devices made using thermal infiltration.

Figure 2A:
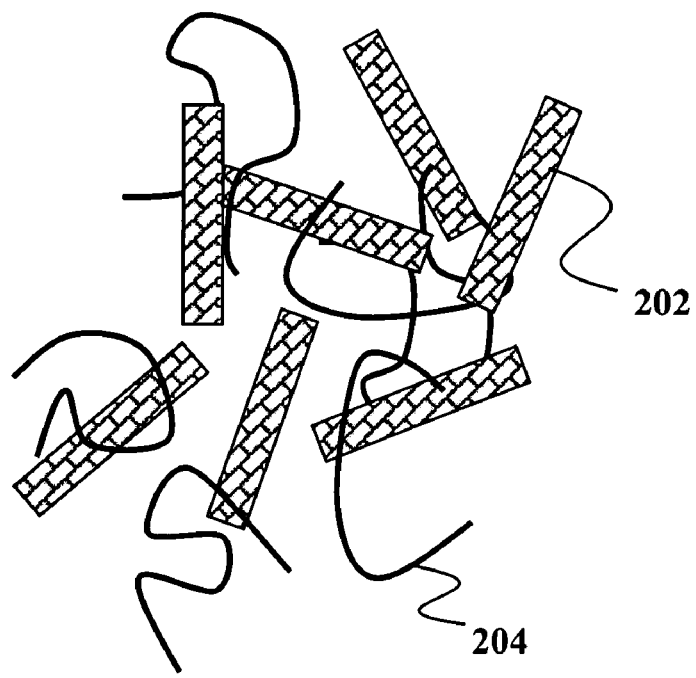
FIGS. 2A–2B are a sequence of schematic diagrams illustrating solvent vapor infiltration of a polymer into nanotubes according to an alternative embodiment of the present invention.
Figure 2B:
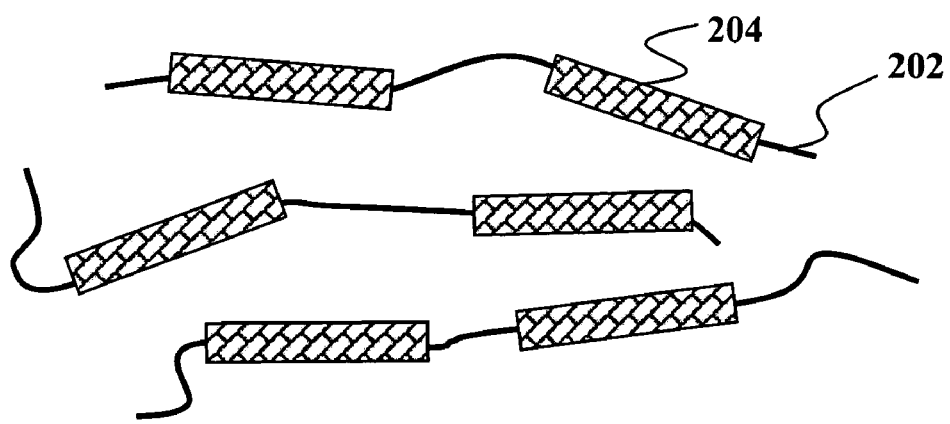

Solvent vapor infiltration of organic materials is not limited to nanostructured templates. Solvent vapor infiltration can be applied to filling spaces in nanostructures that have been formed by techniques such as surfactant temptation. Furthermore, solvent vapor infiltration can also be applied to filling organic materials into nanostructures in forms other than nanostructured templates. For example, as shown in FIG. 2A, groups of isolated such as nanotubes 202 could be blended within a polymer matrix having polymer chains 204. After exposing the nanostructure-polymer mixture to solvent vapor, the polymer chains infiltrate the nanotubes as shown in FIG. 2B. The nanotubes 202 could be connected to each other by polymer chains leading to the possibility of self-assembly of the polymer chains 204 and nanotubes 202 into a well-ordered interdigitated array.

Embodiments of the present invention demonstrate that solvent vapor infiltration is a viable alternative to thermal infiltration. Solvent vapor infiltration is particularly useful for MEH—PPV and other organic materials such as polymers that would otherwise require temperatures of order 200° C. or higher to melt/infiltrate material into spaces 5–1000 nm wide. In principle, however, solvent vapor infiltration can also be applied to spaces that are either narrower or wider than this range.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. The appended claims are not to be interpreted as including means-plus-function limitations, unless such a limitation is explicitly recited in a given claim using the phrase "means for."

What is claimed is:

1. A method for infiltrating an organic material into spaces in one or more nanostructures, comprising:
    disposing the organic material proximate the nanostructures; and
    infiltrating the organic material into the spaces in the nanostructures by exposing the organic material to a solvent vapor.

2. The method of claim 1 wherein disposing the organic material proximate the nanostructures includes disposing a layer of a polymer process solution on a nanostructured template.

3. The method of claim 2 wherein the nanostructured template has spaces between about 5 nm and about 1000 nm wide.

4. The method of claim 2 wherein the spaces in the nanostructured template include tubes between about 1 nm and about 1000 nm in diameter with a tube density between about $10^{12}$ tubes/m$^2$ and about $10^{16}$ tubes/m$^2$.

5. The method of claim 1, wherein the nanostructures include one or more nanopores, cavities, or interstitial spaces between pores, tubes or rods.

6. The method of claim 5 wherein disposing the organic material proximate the nanostructures includes mixing the nanotubes into a polymer process solution.

7. The method of claim 1 wherein the organic material is a small molecule.

8. The method of claim 1 wherein the organic material is a pigment, dye or fullerene.

9. The method of claim 1 wherein the organic material is a polymer.

10. The method of claim 9 wherein the polymer includes one or more polymers selected from the group of poly (phenylene) and derivatives thereof, poly(phenylene vinylene) and derivatives thereof (e.g., poly(2-methoxy-5-(2-ethyl-hexyloxy)-1,4-phenylene vinylene (MEH—PPV), poly(para-phenylene vinylene), (PPV)), PPV copolymers, poly(thiophene) and derivatives thereof (e.g., regioregular poly(3-octylthiophene-2,5,-diyl), regiorandom poly(3-octylthiophene-2,5,-diyl), poly(3-hexylthiophene) (P3HT), regioregular poly(3-hexylthiophene-2,5-diyl), regiorandom poly(3-hexylthiophene-2,5-diyl)), MDMO, poly(thienylenevinylene) and derivatives thereof, and poly(isothianaphthene) and derivatives thereof, tetra-hydro-thiophene precursors and derivatives thereof, poly-phenylene-vinylene and derivatives organometallic polymers, polymers containing perylene units, poly(squaraines) and their derivatives, discotic liquid crystals polyfluorenes, polyfluorene copolymers, polyfluorene-based copolymers and blends, polyfluorene-based copolymers co-polymerized and/or blended with charge transporting compounds and/or light absorbing compounds, polyfluorene-based copolymers co-polymerized and/or blended with tri-phenyl-amines and derivatives, polyfluorene-based copolymers co-polymerized and/or blended with fused thiophene rings and derivatives, generally hetero-atom ring compounds with or without substituents, and/or fullerenes, dyes or pigments.

11. The method of claim 10 wherein the solvent vapor is selected from the group of acetone, chloroform, benzene, cyclohexane, dichloromethane, ethanol, diethyl ether, ethyl acetate, hexane, methanol, toluene, xylene, mixtures of two or more of these, and derivatives of one or more of these.

12. A method for making an optoelectronic device, comprising:
   providing a nanostructured template having spaces between one or more nanostructures;
   infiltrating an organic material into the spaces by disposing the organic material proximate the nanostructures and exposing the organic material to a solvent vapor; and
   placing the nanostructured template and or organic material in electrical contact with an electrode.

13. The method of claim 12 wherein disposing the organic material proximate the nanostructures includes disposing a layer of an organic process solution on a nanostructured template.

14. The method of claim 12 wherein the spaces in the nanostructured template include tubes between about 1 nm and about 1000 nm in diameter with a tube density between about $10^{12}$ tubes/m$^2$ and about $10^{16}$ tubes/m$^2$.

15. The method of claim 12 wherein the organic material includes small molecules.

16. The method of claim 15 wherein the small molecules include pentacene or pentacene precursors.

17. The method of claim 12 wherein the organic material is a pigment, dye or fullerene.

18. The method of claim 12 wherein the organic material is a polymer.

19. The method of claim 18 wherein the polymer includes one or more polymers selected from the group of poly (phenylene) and derivatives thereof, poly(phenylene vinylene) and derivatives thereof (e.g., poly(2-methoxy-5-(2-ethyl-hexyloxy)-1,4-phenylene vinylene (MEH—PPV), poly(para-phenylene vinylene), (PPV)), PPV copolymers, poly(thiophene) and derivatives thereof regioregular poly(3-octylthiophene-2,5,-diyl), regiorandom poly(3-octylthiophene-2,5,-diyl), poly(3-hexylthiophene) (P3HT), regioregular poly(3-hexylthiophene-2,5-diyl), regiorandom poly (3-hexylthiophene-2,5-diyl), MDMO, poly (thienylenevinylene) and derivatives thereof, and poly (isothianaphthene) and derivatives thereof, tetra-hydrothiophene precursors and derivatives thereof, polyphenylene-vinylene and derivatives organometallic polymers, polymers containing perylene units, poly (squaraines) and their derivatives, discotic liquid crystals polyfluorenes, polyfluorene copolymers, polyfluorene-based copolymers and blends, polyfluorene-based copolymers co-polymerized and/or blended with charge transporting compounds and/or light absorbing compounds, polyfluorene-based copolymers co-polymerized and/or blended with tri-phenyl-amines and derivatives, polyfluorene-based copolymers co-polymerized and/or blended with fused thiophene rings and derivatives, generally hetero-atom ring compounds with or without substituents, and/or fullerenes, dyes or pigments.

20. The method of claim 12 wherein solvent vapor is selected from the group of acetone, chloroform, benzene, cyclohexane, dichloromethane, ethanol, diethyl ether, ethyl acetate, hexane, methanol, toluene, xylene, mixtures of two or more of these, and derivatives of one or more of these.

* * * * *